(12) United States Patent
Piedl et al.

(10) Patent No.: US 6,525,502 B1
(45) Date of Patent: Feb. 25, 2003

(54) CLOSED LOOP CONTROL OF MOTOR POSITION AND VELOCITY

(75) Inventors: Martin Piedl, Blacksburg, VA (US);
Moe K. Barani, Radford, VA (US);
Ron Flanary, Blacksburg, VA (US)

(73) Assignee: Aspen Motion Technologies, Inc., Radford, VA (US)

( * ) Notice: Subject to any disclaimer, the term of this patent is extended or adjusted under 35 U.S.C. 154(b) by 0 days.

(21) Appl. No.: 09/806,622

(22) PCT Filed: Sep. 2, 1999

(86) PCT No.: PCT/US99/20148
§ 371 (c)(1),
(2), (4) Date: Sep. 20, 2001

(87) PCT Pub. No.: WO00/14696
PCT Pub. Date: Mar. 16, 2000

(51) Int. Cl.[7] ............................................. G05B 19/31
(52) U.S. Cl. ........................ 318/605; 318/661; 318/600
(58) Field of Search ................................ 318/600, 605, 318/661, 138, 254, 439

(56) References Cited

U.S. PATENT DOCUMENTS

| | | | | | |
|---|---|---|---|---|---|
| 4,270,077 A | * | 5/1981 | Swartz et al. | ................ | 318/661 |
| 4,334,179 A | * | 6/1982 | Grimes et al. | ............... | 318/661 |
| 5,155,696 A | * | 10/1992 | Shibata et al. | ......... | 364/571.01 |
| 5,241,268 A | * | 8/1993 | Lee | ....................... | 324/207.25 |
| 5,760,562 A | * | 6/1998 | Woodland et al. | ........... | 318/632 |
| 5,912,638 A | * | 6/1999 | Vlahu | ......................... | 341/116 |
| 6,084,376 A | * | 7/2000 | Piedl et al. | ................. | 318/605 |

\* cited by examiner

Primary Examiner—Robert E. Nappi
Assistant Examiner—Rina I. Duda
(74) Attorney, Agent, or Firm—Quarles & Brady LLP (57) ABSTRACT

A digital signal processor for closed loop velocity or position control receives sine winding output signals and cosine winding output signal from a resolver, digitizes the signals and outputs quadrature encoded signals to an excitation circuit. The excitation circuit is connected to an excitation winding in the resolver to provide signals for driving the resolver.

8 Claims, 6 Drawing Sheets

CLOSED LOOP CONTROL OF MOTOR POSITION AND VELOCITY

TECHNICAL FIELD

This invention relates to resolvers, optical encoders and other feedback devices for closed loop position or velocity control of an electric motor.

BACKGROUND ART

Many motor applications require position or velocity feedback information to compare with a commanded output to provide a closed loop type of control. This position information is provided by an optical encoder which is attached to the motor shaft. The standard output of any optical encoder is typically a quadrature format signal which can be easily interpreted using standard hardware.

The majority of applications that use resolvers are very high end applications such as machine tool, industrial automation, military, etc. These resolvers typically consist of a wound stator with three windings (a primary, and two output windings, sine and cosine) and a rotor with a single winding which acts as a rotary transformer. The cost of a resolver becomes more significant as the size of the motor decreases and/or the market becomes price sensitive. Therefore, another type of resolver has been investigated, called a variable reluctance resolver, which does not have a rotor winding. Reluctance resolvers are easier to manufacture than conventional resolvers but are not as accurate as a convention resolver. The winding on the rotor is eliminated which significantly simplifies construction and decreases the overall cost of the resolver. A reluctance resolver typically has a laminated or solid rotor with a specific geometry to match the stator windings. The stator of a reluctance resolver is similar but less complex than a conventional resolver. The stator has a primary input and two outputs (sine and cosine) just like a conventional resolver. However, this type of resolver has not been widely commercially accepted because it requires costly resolver-to-digital converters to interpret the output of the resolver. In addition, the resolver-to-digital chip converter requires the resolver output to be very sinusoidal. Any deviations of the resolver output from a sinusoidal wave form will result in erroneous interpretation of the resolver's position. Therefore, the variable reluctance resolver must produce a truly 100% sinusoidal wave form which restricts the number of variable reluctance resolvers and manufacturing techniques applicable for use with a resolver-to-digital converter chip.

Regardless of the type of resolver used, a resolver-to-digital converter is typically used to decode the resolver into a usable digital format. The cost of a converter is, like the conventional resolver, very significant in volume applications.

SUMMARY OF THE INVENTION

An object of this invention is the provision of a low cost resolver system with sufficient accuracy and resolution to generate closed loop motor position and/or velocity control of both brushless motors and motors which use commutating brushes.

Briefly, this invention details the provision of a system in which a resolver is excited with a high frequency, periodic signal and the sine and cosine resolver outputs are transmitted to inputs to a processor, preferably to a commercially available motion control digital signal processor (DSP) (henceforth referred to as "processor". The processor demodulates the sine and cosine outputs to provide samples of the sine and cosine of the rotor position. The sample values are converted to digital values which are used to calculate the shaft angular position. The calculations may incorporate correction factors to compensate for distortions and inaccuracies.

To make the such a low cost sine wave system useful for an application where a position or velocity loop is closed external to the drive, quadrature encoder pulses are generated using the on-board outputs available on a motion control digital signal processor (DSP). One method is described in the quadrature encoder pulse block diagram description. However, there are other methods/algorithms which can be used to generate the quadrature encoder pulse outputs. The one described herein is only a representative sample. Different algorithms would have different overall results on the output. For example, one algorithm which may result in extreme accuracy would consume significant processor overhead whereas one which is not as accurate would consume less processor overhead.

BRIEF DESCRIPTION OF THE DRAWINGS

The foregoing and other objects, aspects and advantages will be better understood from the following detailed description of a preferred embodiment of the invention, in which.

DETAILED DESCRIPTION OF A PREFERRED EMBODIMENT

Figure 1:
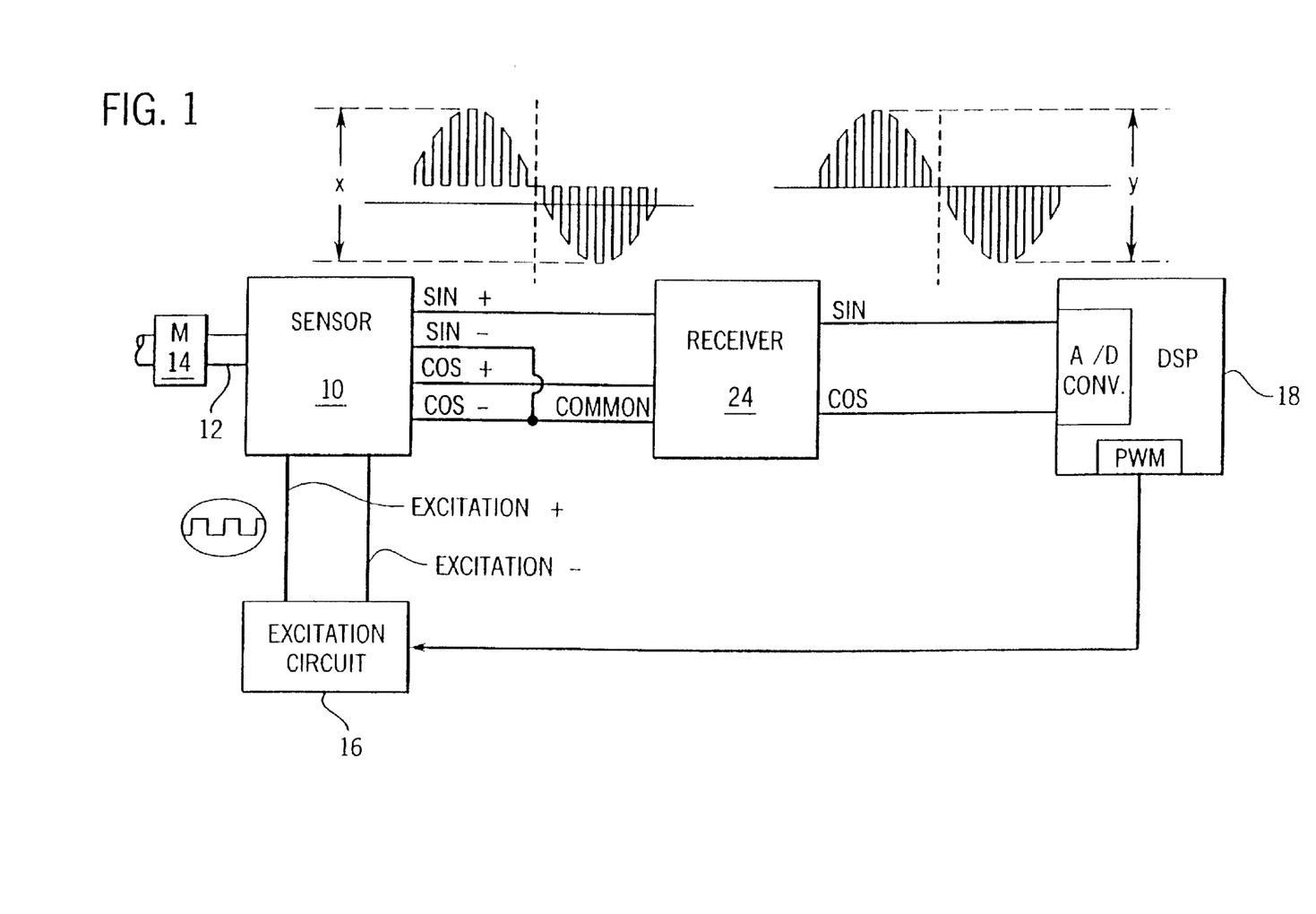
FIG. 1 is a functional block diagram of one embodiment of a shaft position sensing system in accordance with the teachings of this invention.

Referring now to FIG. 1, a shaft angular position sensor 10 is attached to the shaft 12 of a motor 14. Although not limited thereto, in a specific embodiment motor 14 is a brushless, permanent magnet motor. The sensor 10 is a resolver with cosine and sine outputs. In a preferred embodiment of the invention, a low cost, variable reluctance resolver is used, such as, for example, the resolver disclosed in U.S. Pat. No. 4,631,510. Here it will be appreciated that there has been a trade off in the prior art systems between the cost of the system and accuracy and resolution to which the shaft position can be determined and that the system of this invention provides a high accuracy and resolution at low cost.

The stator coils of the resolver 10 are excited by a pulse train output from a coil exciter driver 16 whose input is coupled to an output of a processor 18. The processor 18 is preferably a commercially available digital signal processor (DSP) typically used for motion and speed control applications, such as the DSPs available from Texas Instruments and Analog Devices. Such DSPs include integral analog-to-digital input convertors and digital outputs that can be pulse width modulated. Alternatively to the use of a DSP, a microprocessor or other logic circuits programmed to perform the functions herein described can be used as processor 18.

The pulse output of the processor 18 in this application is constant frequency, constant pulse width. The function of this output is to maintain and insure synchronization between the resolver coil excitation and the points at which the outputs of the resolver are sampled. With a square wave pulse excitation, as shown in the exemplary embodiment of the invention, the resolver outputs are square waves in amplitude which are modulated by the sine and cosine functions of the shaft angular position. These sine/cosine modulated outputs of the resolver are coupled as inputs to the processor 18 which, as part of the analog-to-digital conversion process, samples the value of the inputs synchronously with the coil excitation and at the peak of each pulse. These sample values, which are converted to digital values for processing, thus provide the values of the modulated envelope of the resolver outputs, i.e. the sine and cosine values. Here it will be appreciated that this simplifies the analog-to-digital conversion process. The sample rate can be at the same rate as the coil excitation frequency, which preferably is relatively low, for example about 20 kHz, without loss of sine or cosine data. While square wave excitation is used in this illustrative embodiment, other pulse wave forms may be used to excite the resolver stator coils, for example, a pulse stream with a trapezoidal wave form.

A receiver circuit 24 scales and level shifts the resolver outputs, if necessary, to provide a signal properly interfaced to the input of processor 18.

Figure 2:
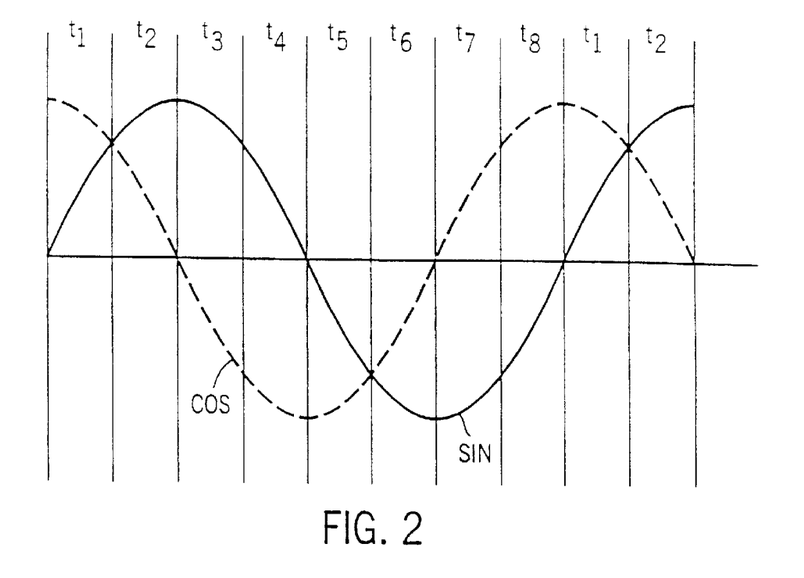
FIG. 2 is a diagram illustrating the sine and cosine resolver outputs as a function of shaft position and the division of each cycle into eight sectors.
Figure 3:
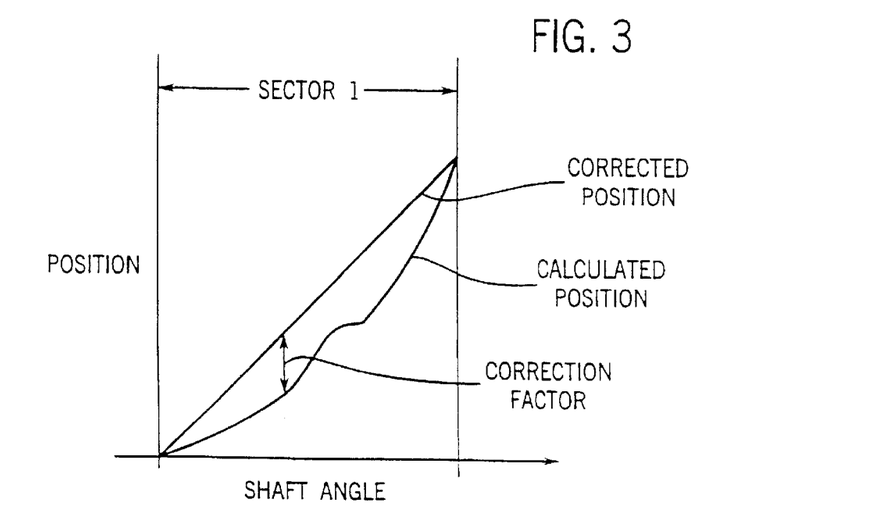
FIG. 3 is a diagram illustrating the amplitude of the demodulated correction factor, showing a shaft position calculated on the basis of the resolver outputs and a corrected position which is the actual position.

Referring now to FIGS. 2 and 3, the processor 18 is programmed to convert the digitized sine and cosine values to a shaft angular position value using a suitable prior art resolver algorithm. In a specific embodiment of the invention the processor 18 is programmed to divide each 360 degree shaft revolution into eight 45 degree sectors as illustrated in FIG. 2. Based on the values and/or state of the cosine and sine functions relative to one another, the processor 18 determines in which one of the eight sectors the reference point of the shaft lies. Then, based on these sine and cosine values, it calculates an angular position of the reference within the sectors. To correct for inaccuracies and distortions associated with the resolver outputs, a decoding correction factor (illustrated in FIG. 3) is applied to the calculated shaft angular position. The processor 19 uses the estimated shaft correction factor within a segment to address and to fetch a correction factor from a look-up table. The angular position of the sector is added to the calculated shaft angular position within a sector in order to obtain the corrected shaft angular position.

These corrected factors (illustrated in FIG. 3), may be determined empirically by comparing the calculated angular position with the measured position for each resolver or a class of resolvers and storing the correction factors. The correction factor may be addressed by the estimated angular position level and the sector. The corrected value of the shaft angular position within a sector number are used to determine the shaft angular position "A" within a 360 degree revolution.

Figure 4:
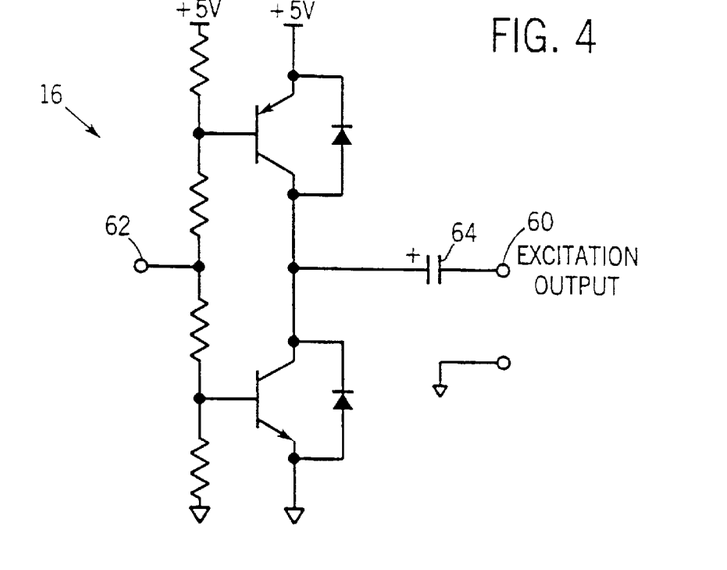
FIG. 4 is a schematic diagram of an exemplary driver circuit for exciting the resolver in the system shown in FIG. 1.
Figure 5:
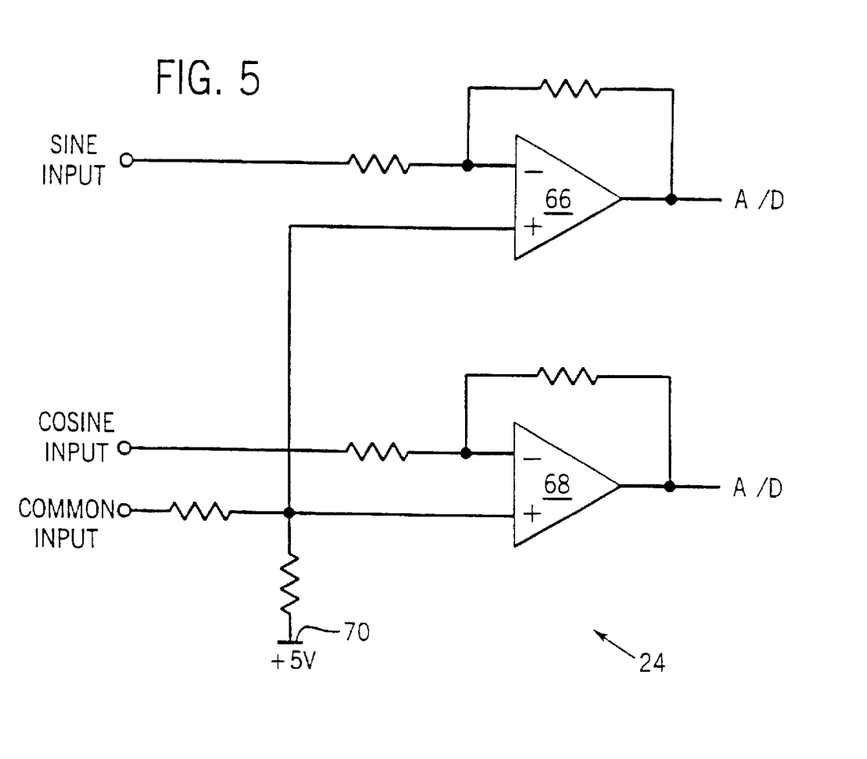
FIG. 5 is a schematic design of an exemplary circuit for level shifting and scaling the input to the processor.

FIG. 4 shows one specific embodiment of the driver circuit 16, here shown as a discrete component embodiment, although it will be appreciated the driver could be implemented as a single integrated circuit. The NPN, PNP transistor pair alternatively couple the output 60 to plus V (e.g. +5 volts) and ground depending on the state of the square wave input 62. The capacitor 64 blocks any d.c. voltage from the output 60, and the diodes across the transistors provide a current path for current flow as the input changes. FIG. 5 shows one specific example of a receiver circuit 24 using two operational amplifiers 66 and 68 with a common reference 70 for scaling the peak-to-peak value of the resolver sine and cosine outputs to a desired value to input to the processor 18 and for providing a voltage offset to accommodate the unipolar inputs of the processor of the sine and cosine values changes at zero volts.

Figure 6:
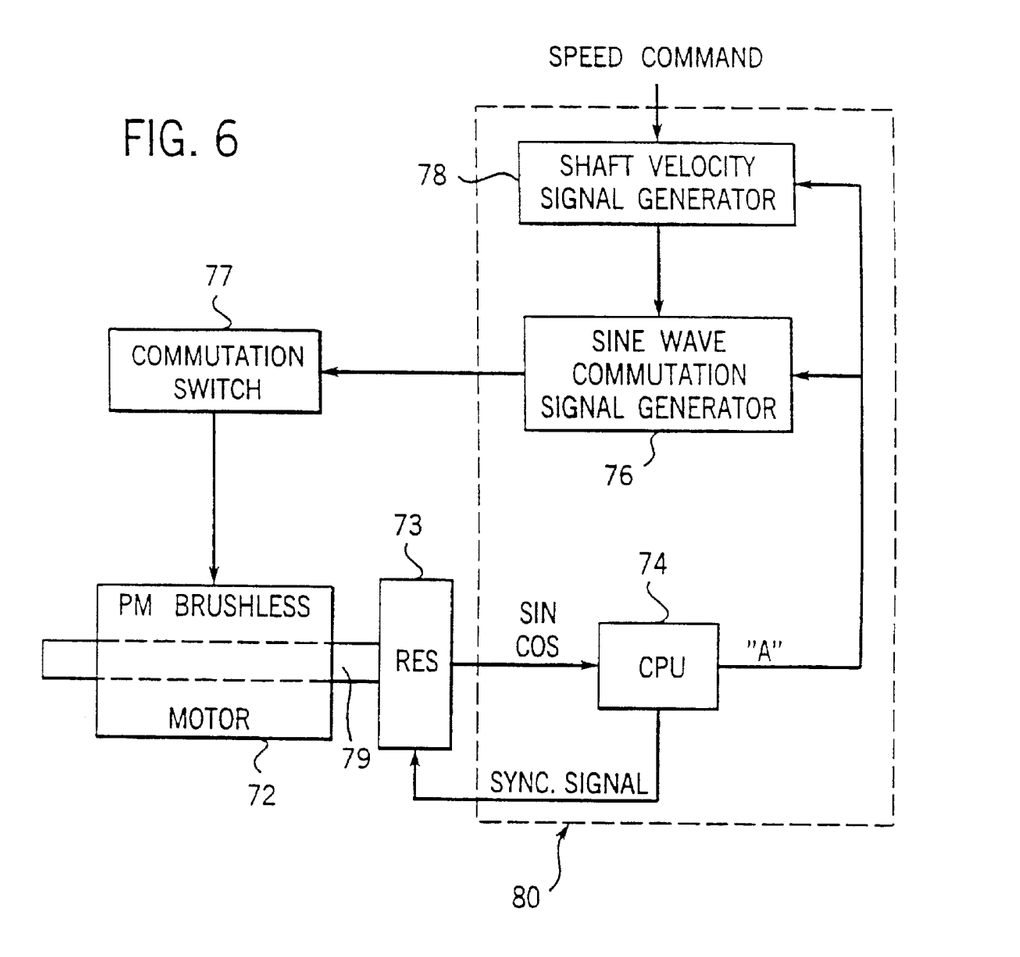
FIG. 6 is a simplified block diagram showing exemplary applications of the invention to motor control.

FIG. 6 shows, in block diagram form, the system of the invention described above in use to provide sine wave commutation for a motor 72, and also control of motor speed. It will be appreciated that the system of this invention can provide these control functions in combination as shown here, or individually as desired and that other control functions can be performed either in combination or individually. The shaft of the permanent motor 72 is connected to a variable reluctance resolver 73 whose sine and cosine outputs are connected to a system 74 of the type described above in connection with FIGS. 1–5. The output A of system 74, which represents the instantaneous angular position of the motor shaft, is coupled as an input to a suitable prior art angular position to sine wave commutation signal generator 76. The output of the signal generator 76 is coupled as a feedback signal to a stator winding commutation switch 77, which commutates the power to the stator windings in accordance with sine wave function signals based upon the angular position of the shaft as in prior art sine wave commutation systems. Similarly, the shaft angular position output signal A can be coupled as an input to a suitable prior art shaft rotational speed signal generator 78 (e.g. speed equals the derivative of change in shaft position angle with respect to time) where the feedback signal is compared with a reference, and the error signal is used to control the output of the signal generator 76. The output of the signal generator 78 is coupled to the commutation signal generator 76, which is coupled to the commutation switch 77. Note that in this preferred embodiment the functions of 74, 76 and 78 are all integrated together in a single motion control DSP chip to minimize system cost.

Figure 7:
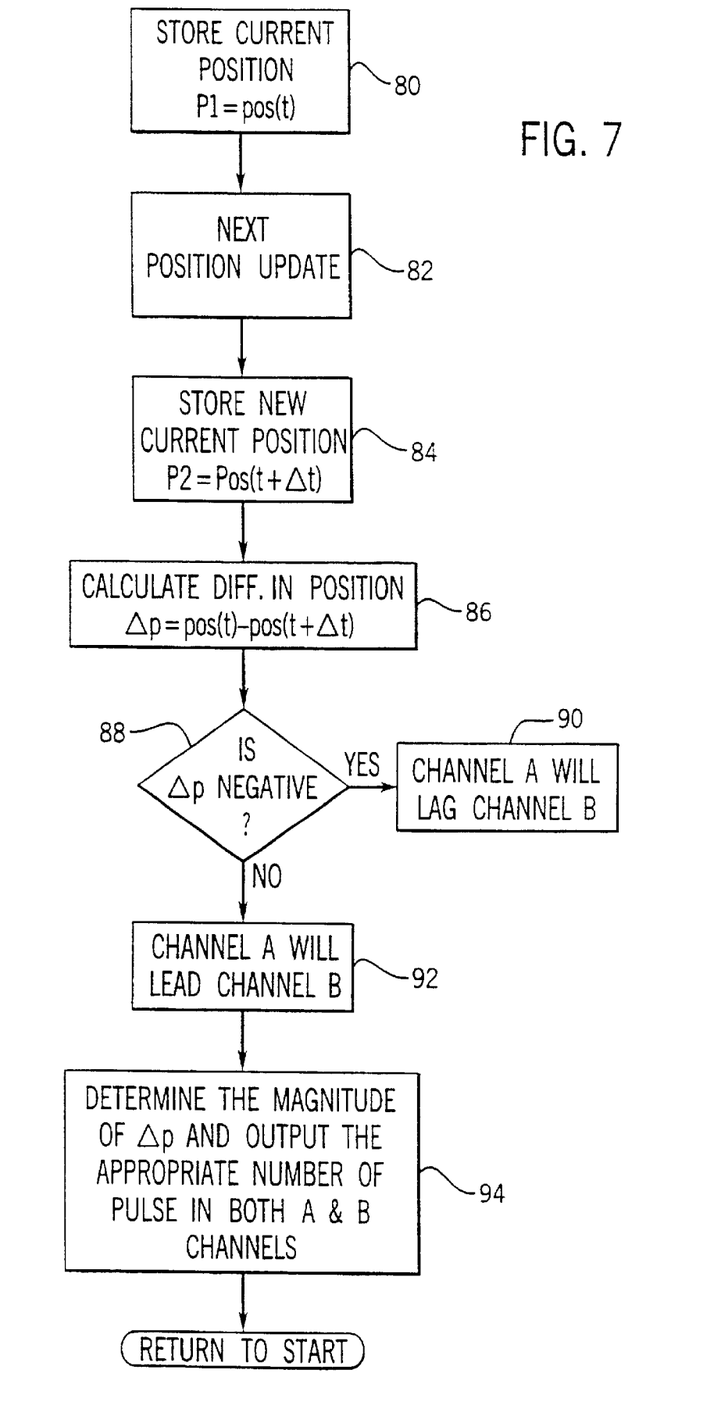
FIG. 7 is a flow chart of the operation of the digital signal processor of FIG. 6 in generalizing a quadrature output signal indicative of motor shaft angular position and/or angular velocity.
Figure 8:
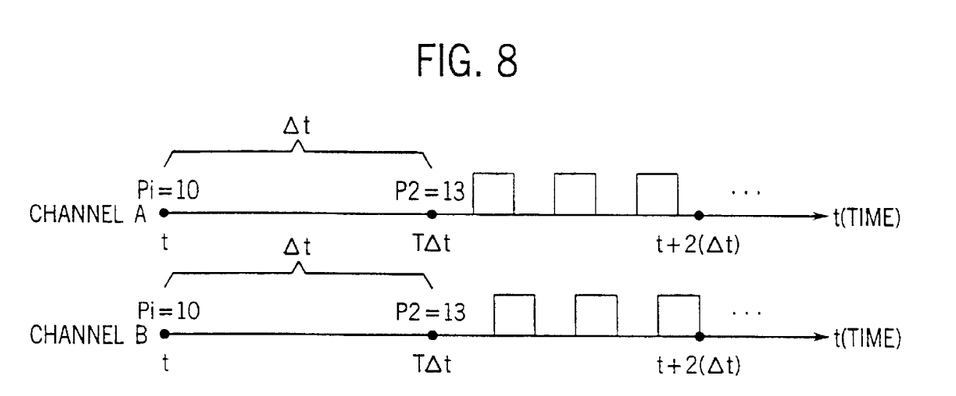
FIG. 8 is a quadrature encoder pulse diagram of output signals from the digital signal processor.

Advantageously, the onboard outputs available on the motion control digital signal processor 74 can be used to generate quadrature output pulse similar to the quadrature output pulses generated by an optical encoder. Referring now to FIG. 7, the digital signal processor 74 stores block 80 the current angular position (p1=pos t) of the motor output shaft, which position is derived from the sine and cosine outputs of the resolver 73. The processor of 74 updates the position information at fixed time intervals (p2=pos t+Δt), block 82 to determine the then current angular position. At block 84, the processor stores this new current position and at block 86 it calculates the difference in angular position (Δp=p1−p2). Decision block 88 determines whether or not Δp is positive or negative. As in an optical encoder, the processor 74 generates a series of pulses on two channels, designated here as channel A and channel B. The number of pulses in a given sample period indicate the magnitude of the change in angular position and the relative phase of the pulses on channel A and channel B indicate the direction of the change in angular shaft position. This is illustrated graphically in FIG. 8. In this example, if Δp is negative, the output pulses on channel A will lag the output pulses on channel B (block 90), and if Δp is positive, channel A will lead channel B (block 92) (FIG. 8). In block 94, the processor 74 determines the magnitude of Δp and outputs a predetermined number of pulses on channels A and B indicative of the magnitude of the change in Δp.

It should be noted that this method described results in the reported position being delayed by one position update (Δt). Typically, Δt is very small, which allows the reported position to be used for closing the velocity and/or position for most applications.

It will be appreciated there are other methods/algorithms which can be used to generate the quadrature encoder pulse outputs. The ones described herein are only a representative sample. Different algorithms would have different overall results on the output. For example, one algorithm which may result in extreme accuracy would consume significant processor overhead whereas one which is not as accurate would consume less processor overhead.

While the invention has been described in terms of a single preferred embodiment, those skilled in the art will recognize that the invention can be practiced with modification within the spirit and scope of the appended claims.

We claim:

1. A system for determining the angular position of the shaft of a motor, comprising in combination:

a resolver coupled to said shaft, said resolver including a sine winding, a cosine winding, and an excitation winding;

a processor including an analog-to-digital convertor input stage that demodulates signals from the sine winding and the cosine winding;

a driver for supplying an excitation signal to said excitation winding;

wherein said sine winding and said cosine winding are each electrically connected to transmit signals to said input stage of said processor, said input stage sampling signals from said sine winding and said cosine winding synchronously with the peaks of said excitation signal so that respective sample values represent sine and cosine envelope values;

wherein said processor is operable to convert signals from said sine winding and said cosine winding to digital values and wherein said processor is operable to calculate said angular position from said digital values; and wherein said processor is operable for generating a quadrature encoded pulse stream indicating the magnitude and direction of a change in said angular position.

2. The system of claim 1, wherein said processor is a digital signal processor.

3. The system of claim 1, wherein said processor calculations incorporate at least one correction factor to compensate for an inaccuracy condition.

4. The system of claim 1, wherein the quadrature encoded pulse stream emulates an output of an optical encoder.

5. The system of claim 1, wherein said excitation signal has a square wave form.

6. The system of claim 1, wherein said excitation signal has a trapezoidal wave form.

7. The system of claim 1, wherein said resolver is a reluctance resolver.

8. The system of claim 1, in which the quadrature encoded pulse stream has a channel A pulse stream and a channel B pulse stream, and wherein the direction of shaft rotation is represented by a polarity of a phase difference between the channel A pulse stream and the channel B pulse stream.

* * * * *

UNITED STATES PATENT AND TRADEMARK OFFICE
CERTIFICATE OF CORRECTION

PATENT NO. : 6,525,502 B1  Page 1 of 1
DATED : February 25, 2003
INVENTOR(S) : Martin Piedl, Moe K. Barani and Ron Flanary

It is certified that error appears in the above-identified patent and that said Letters Patent is hereby corrected as shown below:

<u>Title page,</u>
Item [57], ABSTRACT,
Line 3, "signal" should be -- signals --.
Item [86], "§ 371 (c)(1),
 (2), (4) Date:" should be -- March 26, 2001 --.

<u>Column 3,</u>
Line 53, "processor 19" should be -- processor 18 --.

Signed and Sealed this

Twenty-ninth Day of July, 2003

JAMES E. ROGAN
*Director of the United States Patent and Trademark Office*